United States Patent [19]

Nistler et al.

[11] Patent Number: 6,096,616
[45] Date of Patent: Aug. 1, 2000

[54] FABRICATION OF A NON-LDD GRADED P-CHANNEL MOSFET

[75] Inventors: John L. Nistler, Martindale; Mark W. Michael, Cedar Park, both of Tex.

[73] Assignee: Advanced Micro Devices, Inc., Sunnyvale, Calif.

[21] Appl. No.: 09/080,658

[22] Filed: May 18, 1998

[51] Int. Cl.⁷ ............................................... H01L 21/336
[52] U.S. Cl. ........................ 438/305; 438/307; 438/529
[58] Field of Search .................................... 438/303, 305, 438/306, 307, 529, 546, 549

[56] References Cited

U.S. PATENT DOCUMENTS

| | | | |
|---|---|---|---|
| 5,225,357 | 7/1993 | Ho | 438/307 |
| 5,268,317 | 12/1993 | Schwalke et al. | 438/306 |
| 5,817,564 | 10/1998 | Church et al. | 438/307 |

*Primary Examiner*—CHandra Chaudhari
*Attorney, Agent, or Firm*—Kevin L. Daffer; Conley, Rose & Tayon

[57] ABSTRACT

A transistor and transistor fabrication method are presented in which a graded junction is formed using a plurality of source/drain dopant implants. The implants are performed such that higher concentrations of dopant species are implanted at lower energies and lower dopant concentrations are implanted at higher energies. In an embodiment, an anneal step is used to create the graded junction by exploiting the concentration dependence of the dopant diffusivity (i.e., dopant species implanted in regions of high concentration are more mobile than dopant species implanted in regions of low concentration). Sub-0.25-micron transistors formed by the process described herein may be less susceptible to deleterious capacitive loading and parasitic resistance than transistors having conventionally formed lightly doped drain and source/drain implants. Transistors formed according to the method of this application may also advantageously include highly doped shallow junctions while incorporating lightly doped deeper junctions to avoid the problem of junction spiking. Integrated circuits including transistors formed according to the method described herein may further be subject to less inter-transistor variation in effective channel length, and therefore threshold voltage roll-off and drive current variability, than integrated circuits including conventionally formed transistors.

15 Claims, 7 Drawing Sheets

FABRICATION OF A NON-LDD GRADED P-CHANNEL MOSFET

BACKGROUND OF THE INVENTION

1. Field of the Invention

This invention relates to integrated circuit fabrication and, more particularly, to forming a p-channel transistor having source and drain regions implanted with multiple energy/dose impurity combinations to form a graded junction.

2. Description of the Related Art

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length, L. However, after implantation and subsequent diffusion of the junctions, the electrical distance between junctions becomes less than the physical channel length and is often referred to as the effective channel length, $L_{eff}$. In VLSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a short $L_{eff}$. Accordingly, reducing L, and hence $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies). Minimizing L also improves the speed of integrated circuits including a large number of individual transistors because the larger drain current associated with a short channel length can drive the adjoining transistors into saturation more quickly. Also, the smaller L has less parasitic capacitance. Minimizing L is, therefore, desirable from a device operation standpoint.

In addition, minimizing L is desirable from a manufacturing perspective because a smaller area of silicon is required to manufacture a transistor having a smaller length. By minimizing the area required for a given transistor, the number of transistors available for a given area of silicon increases, with a corresponding increase in the circuit complexity that can be achieved on the given area of silicon. As layout densities increase, however, the problems associated with fabrication of transistors are exacerbated. Although n-channel devices are particularly sensitive to so-called short-channel effects ("SCE"), SCE also becomes a predominant problem in p-channel devices whenever $L_{eff}$ drops below approximately 0.8 $\mu$m.

A problem related to SCE and the subthreshold currents associated therewith is the problem of hot-carrier effects ("HCE"). HCE are phenomena by which the kinetic energy of the carriers (holes or electrons) is increased as they are accelerated through large potential gradients and subsequently become trapped within the gate oxide. The greatest potential gradient, often referred to as the maximum electric field ("$E_m$"), occurs near the drain during saturated operation. More specifically, the electric field is predominant at the lateral junction of the drain adjacent the channel. The electric field at the drain primarily causes electrons in the channel to gain kinetic energy and become "hot". As hot electrons travel to the drain, they lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in an NMOS transistor, or a negative threshold shift in a PMOS transistor.

To overcome the problems of sub-threshold current and threshold shift resulting from SCE and HCE, an alternative drain structure known as a lightly doped drain ("LDD") is commonly used. The purpose of the LDD is to absorb some of the potential into the drain and thus reduce $E_m$. Fabrication of a conventional LDD structure is depicted in FIGS. 1A–1C. A light concentration of dopant 16 is implanted into semiconductor substrate 10 self-aligned to gate conductor 14 (FIG. 1A). The light implant dose serves to produce a lightly doped section 18 within the junction at the gate edge near the channel 12. Sidewall spacers 20 are then formed adjacent the sidewalls of gate conductor 14, followed by a heavier dopant implant 22 self-aligned to the sidewall spacers (FIG. 1B). The heavy implant dose is spaced from the channel a distance dictated by the thickness of the sidewall spacers. The heavy implant dose forms the source/drain implant 24 placed within the junction laterally outside the LDD area. As a result, a dopant gradient (i.e., "graded junction") occurs at the interface between the source and channel as well as between the drain and channel. Following anneal (FIG. 1C), ions implanted to form LDD 18 may diffuse into channel region 12, thus further decreasing $L_{eff}$. Consequently, less bias overall must be applied to the gate to invert the channel across its full width, a phenomenon known as $V_T$ roll-off. If $L_{eff}$ is decreased to a great enough extent, $V_T$ may be lowered sufficiently to allow a subthreshold current to flow through the channel even when no external voltage is applied, so that the device is always "on". This problem is especially acute with boron ions used to form LDD and source/drain regions in PMOSFETs due to the high diffusivity of boron.

In an attempt to counteract the high diffusivity of boron, PMOSFETs may be formed using the method depicted in FIGS. 2A–2C. First spacers 36 may be formed adjacent opposed sidewalls of gate conductor 34 (FIG. 2A). A light concentration of dopant 38 may then be implanted into semiconductor substrate 30 self-aligned to the first spacers to produce LDD 40. Second sidewall spacers 42 may then be formed adjacent first sidewall spacers 36, followed by a heavier dopant implant 44 self-aligned to the second sidewall spacers to form the source/drain implant 46 (FIG. 2B). The thickness of first spacer 36 may be sufficient to prevent diffusion of implanted boron ions 40 into channel region 32 during anneal, as shown in FIG. 2C.

As the gate width decreases into the sub-quarter-micron range, a concurrent reduction in spacer width is desirable to maintain proper device scaling. Narrow spacer fabrication, however, is at present difficult, and, depending upon processing conditions, the widths of narrow spacers may vary considerably between and even across semiconductor wafers. This may in turn lead to variability in $L_{eff}$ such that $V_T$ exhibits a wide range of values across a semiconductor device. It would therefore be desirable to fabricate sub-quarter-micron MOSFETs in which spacer thickness, and thus $L_{eff}$, is more easily controlled so that $V_T$ roll-off is minimized or eliminated.

SUMMARY OF THE INVENTION

The problems outlined above are in large part solved by the technique hereof for fabricating a transistor in which multiple source/drain impurity implants are self-aligned to a single sidewall spacer to form a graded junction. In one embodiment, a thin layer of silicon dioxide, or "oxide", is thermally grown across a semiconductor substrate, and polycrystalline silicon ("polysilicon") is deposited across the upper surface of the gate oxide. Portions of the polysilicon and the oxide are then removed using optical lithography to define a pair of opposed sidewall surfaces of a gate structure including a polysilicon gate conductor and a gate oxide. A dielectric material may then be deposited across the semiconductor topography and selectively patterned to form a pair of spacers adjacent the opposed sidewall surfaces of the gate conductor.

A series of graded dopant concentrations may then be implanted into regions of the semiconductor substrate self-aligned with the sidewall spacers. The dopant implants are performed such that lighter concentrations of dopant ions are implanted at higher energies, resulting in deeper implants, and higher concentrations of dopant ions are implanted at lower energies, resulting in shallower implants. Following ion implantation, an anneal may be used to repair damage to the substrate caused by the implant and to cause the implanted ions to migrate toward the channel area beneath the gate, forming "finger extensions" from the source/drain areas. Ions implanted in regions of heavy concentration will undergo more extensive lateral and vertical diffusion than ions implanted in low-concentration regions, resulting in a graded junction. Thus, after anneal, the shallow, heavily doped implant regions will extend proximate to and partially into the channel region, whereas the deeper, more lightly doped implant regions will extend only partially beneath the spacers but preferably outside the channel.

Because ions from the heavily doped implant will exhibit greater diffusion, the spacers can be made thicker relative to the gate dimensions. As such, variability in spacer width should be lessened relative to the variability seen in narrow-spacer widths. As $L_{eff}$ depends somewhat on spacer width, this decrease in spacer variability should facilitate formation of transistors having more uniform operating characteristics, such as drive current. Implant ion concentrations and anneal conditions (e.g., anneal temperature and duration) may be controlled such that the extent of ion migration is limited to a desired range. Because the heavily doped implant area extending proximate the channel is also the shallowest implant region, both capacitive loading and series resistance should be minimized as well, thereby increasing device speed.

Following the anneal, a conductive material (e.g., tungsten or titanium) may be deposited upon upper surfaces of the gate structure and the source/drain regions. The presence of the spacers prevents conductive material from forming in regions directly laterally adjacent to the gate conductor where the conductive material could render the transistor inoperable. The semiconductor substrate may then be heated to react the metal with the source/drain regions and the conductive gate structure to form metal silicide exclusively on silicon-based surfaces (i.e., upon the source/drain regions and the gate conductor upper surface). The sheet resistivity of the silicide thereby formed is less than the corresponding sheet resistance of the non-silicided source/drain regions or non-silicided gate conductor.

If silicide formation is allowed to proceed for a sufficient duration, all of the silicon in a shallowly doped implant area may be consumed. As a result, an electrical contact may be formed with the undoped semiconductor substrate beneath the junction, resulting in an electrical short. The presence of the deeper, lightly doped implant areas advantageously serves to reduce the risk of junction spiking.

The method as described herein has the advantage of forming a MOSFET in which finger extensions extend from the source/drain area toward the channel area to form a graded junction. The graded junction may improve device performance by reducing leakage current. Implant and anneal conditions may be controlled to limit the extent to which the finger extensions extend into the channel area, thus decreasing the likelihood of undesirable $V_T$ roll-off. The finger extensions may also advantageously serve to minimize hot carrier effects and short channel effects.

The method as described herein has the further advantage of forming a MOSFET in which capacitive loading is minimized, thus increasing transistor speed and reliability.

The method as described herein has the further advantage of forming a MOSFET in which spacer size is more closely controllable, thus minimizing transistor variability across and between semiconductor wafers.

The method as described herein has the further advantage of forming a shallow, heavily doped source/drain region, thus reducing series resistance and improving device speed, while also forming a deeper, lightly doped junction, thus reducing the risk of junction spiking.

BRIEF DESCRIPTION OF THE DRAWINGS

Other objects and advantages of the invention will become apparent upon reading the following detailed description and upon reference to the accompanying drawings in which.

Figure 1A:
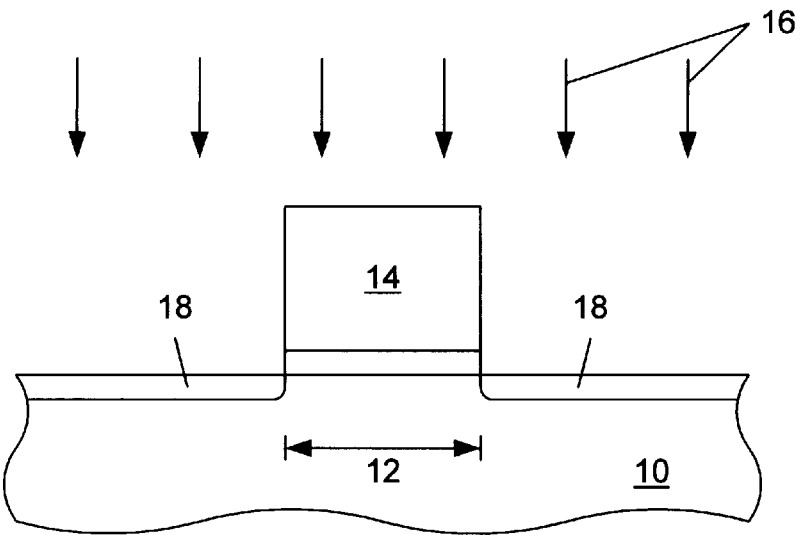
FIGS. 1A–1C are partial cross-sectional views of a semiconductor topography formed according to a method known in the art.
Figure 1B:
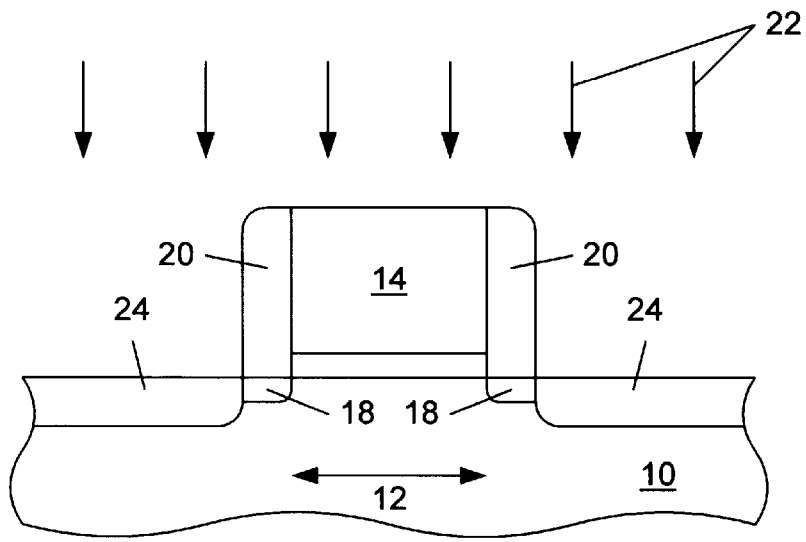
Figure 1C:
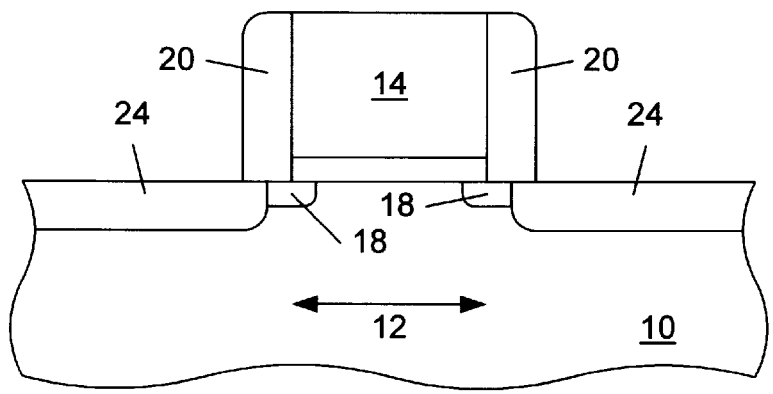
Figure 2A:
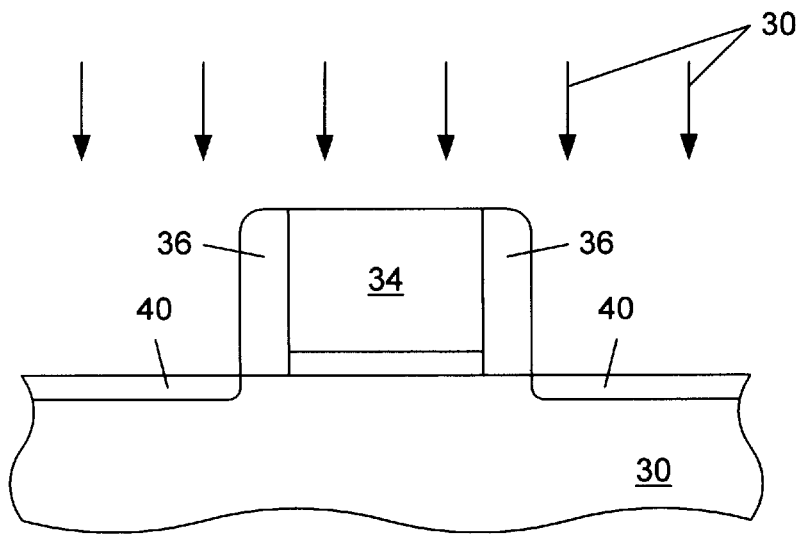
FIGS. 2A–2C are partial cross-sectional views of a semiconductor topography formed according to an alternative method known in the art.
Figure 2B:
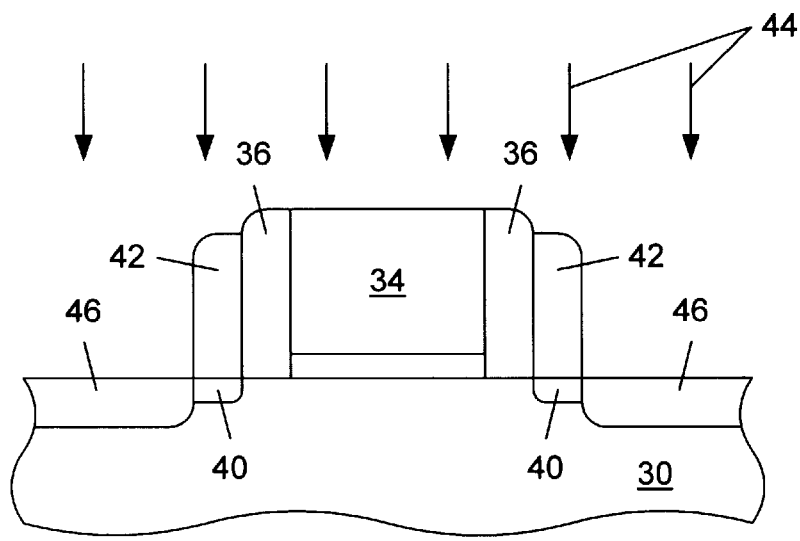
Figure 2C:
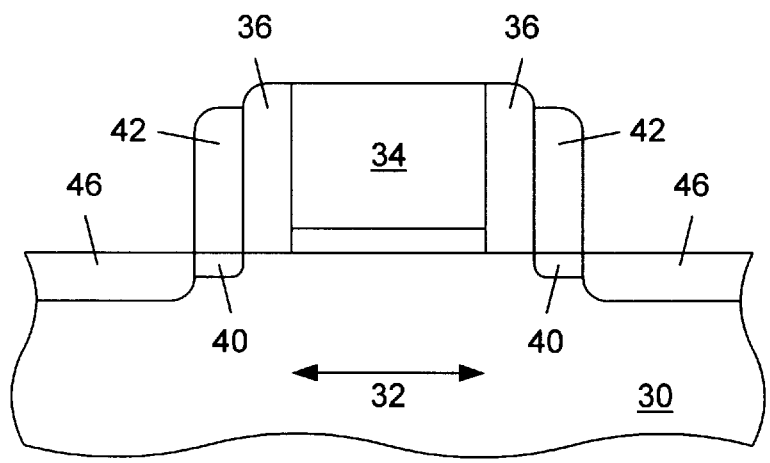

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 3:
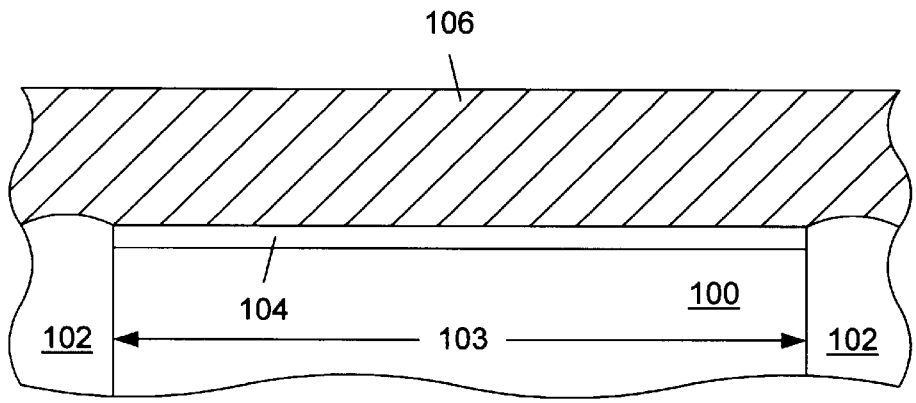
FIG. 3 is a partial cross-sectional view of a semiconductor topography having a conductive gate layer formed a dielectric distance above a semiconductor substrate and between a pair of dielectric isolation regions.

Turning now to the drawings, FIG. 3 illustrates a semiconductor substrate 100 upon which a layer 104 of dielectric material has been formed. Substrate 100 may comprise single crystalline silicon and dielectric isolation regions 102 arranged a spaced distance apart for dielectrically isolating ensuing active areas. One such active area is represented in FIG. 3 by reference numeral 103. Substrate 100 may be slightly doped with n-type or p-type impurities. In an embodiment, dielectric material 104 comprises silicon dioxide ("oxide") formed by deposition from, e.g., a silane- and oxygen-bearing source. Alternatively, the oxide may be thermally grown. A gate conductive layer 106 is arranged upon gate oxide 104. In an embodiment, gate conductive layer 106 is polycrystalline silicon ("polysilicon"). Gate conductive layer 106 may be formed using chemical vapor deposition ("CVD") of polysilicon from a silane source.

Figure 4:
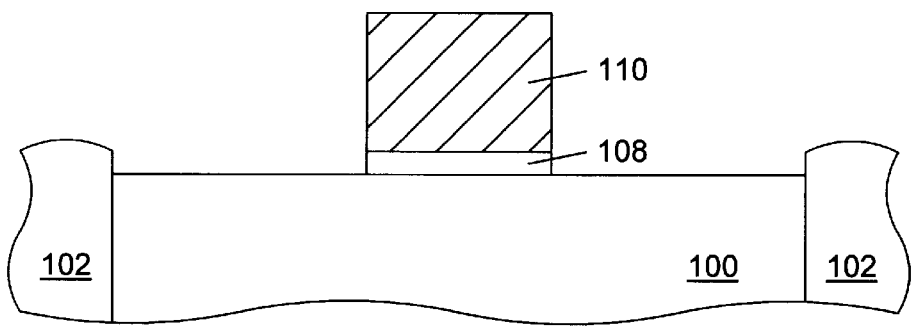
FIG. 4 is a partial cross-sectional view of the semiconductor topography according to a processing step subsequent to FIG. 3, in which the conductive gate layer is patterned to form a gate conductor aligned over a channel region of the semiconductor substrate.
Figure 5:
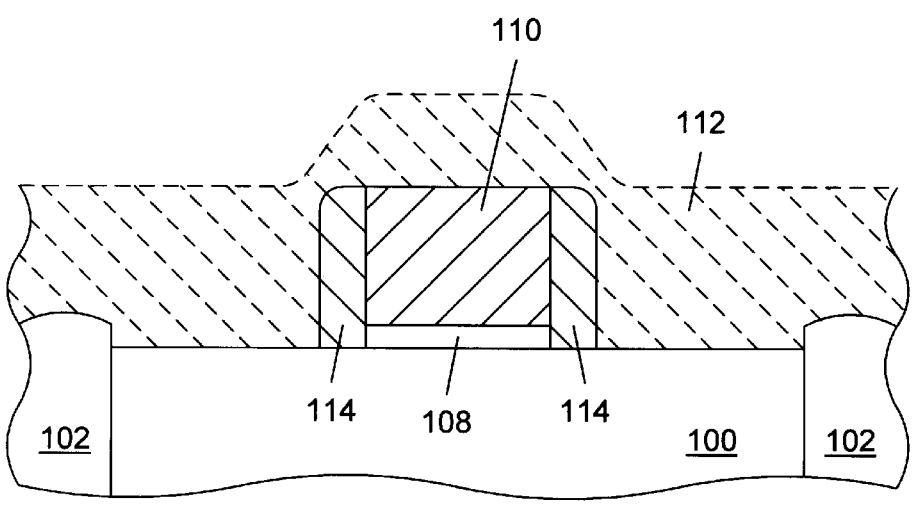
FIG. 5 is a partial cross-sectional view of the semiconductor topography according to a step subsequent to FIG. 4, in which sidewall spacers are formed adjacent exposed sidewalls of the conductive gate structure.

As shown in FIG. 4, gate dielectric 108 and gate conductor 110 may be defined by etching portions of the conductive gate material not covered by a patterned photoresist layer using, e.g., a plasma etch technique. Sidewall spacers 114 may be formed adjacent exposed sidewalls of gate conductor 110, as depicted in FIG. 5. Dielectric material 112 is deposited across exposed surfaces of semiconductor substrate 100, gate dielectric 108, and gate conductor 110. An anisotropic etch is then used to preferentially remove dielectric material 112 from horizontal surfaces of the semiconductor topography while retaining the dielectric material on vertical surfaces. The retained material forms spacers 114 adjacent sidewall surfaces of the gate structure.

Figure 6:
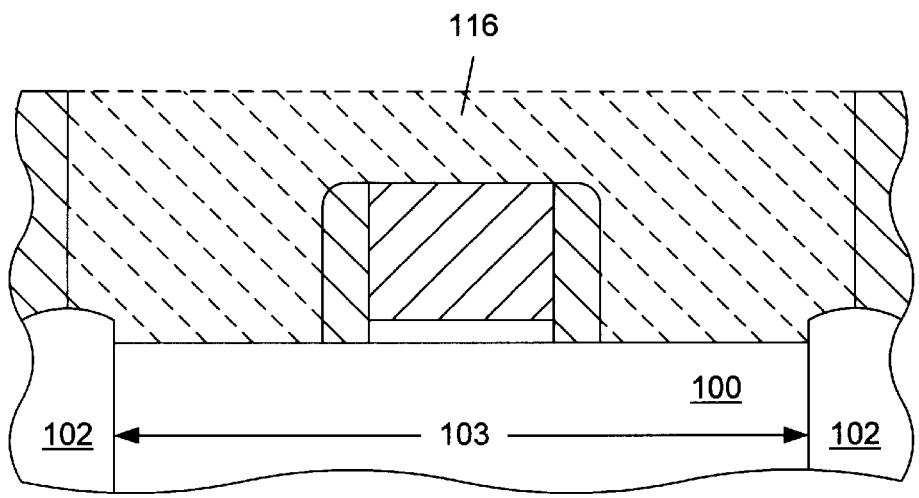
FIG. 6 is a partial cross-sectional view of the semiconductor topography according to a step subsequent to FIG. 5, in which a layer of photoresist is deposited across the semiconductor topography and selectively patterned and removed from above the active region of the semiconductor substrate.
Figure 7:
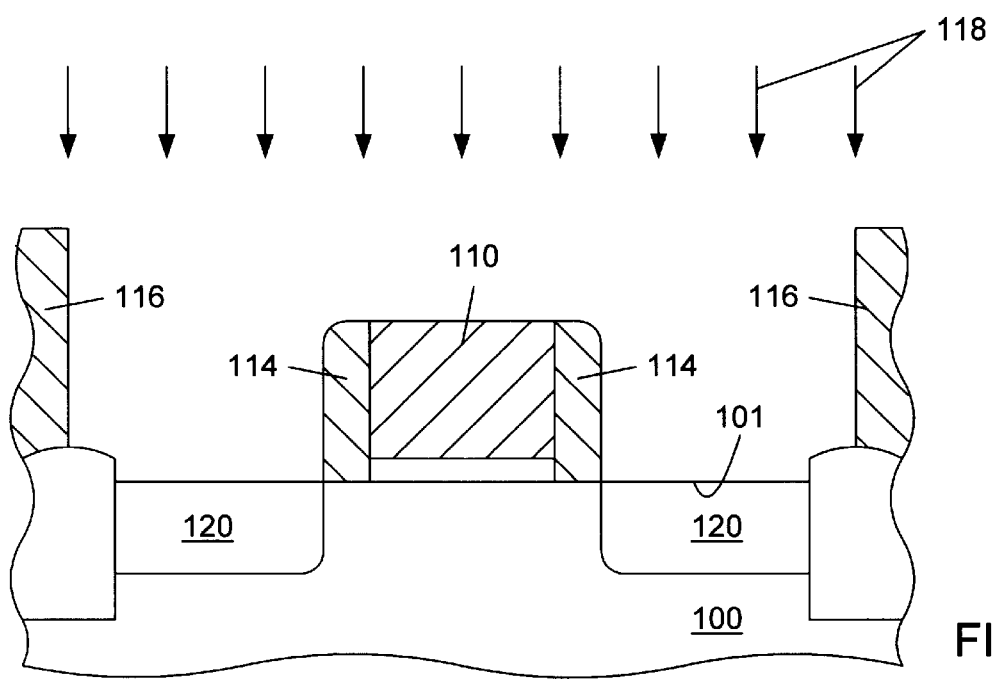
FIG. 7 is a partial cross-sectional view of the semiconductor topography according to a step subsequent to FIG. 6, in which a first impurity implant is forwarded into regions of the semiconductor substrate at a first energy and a first concentration to form first source/drain areas.
Figure 8:
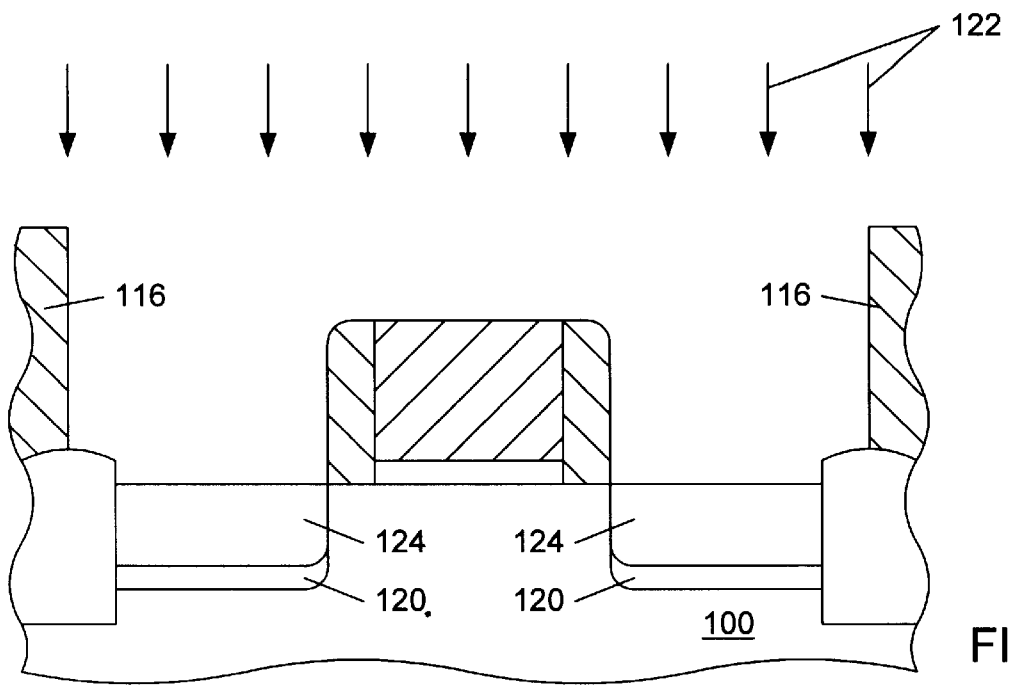
FIG. 8 is a partial cross-sectional view of the semiconductor topography according to a step subsequent to FIG. 7, in which a second impurity implant is forwarded into regions of the semiconductor substrate at a second energy and a second concentration to form second source/drain areas.
Figure 9:
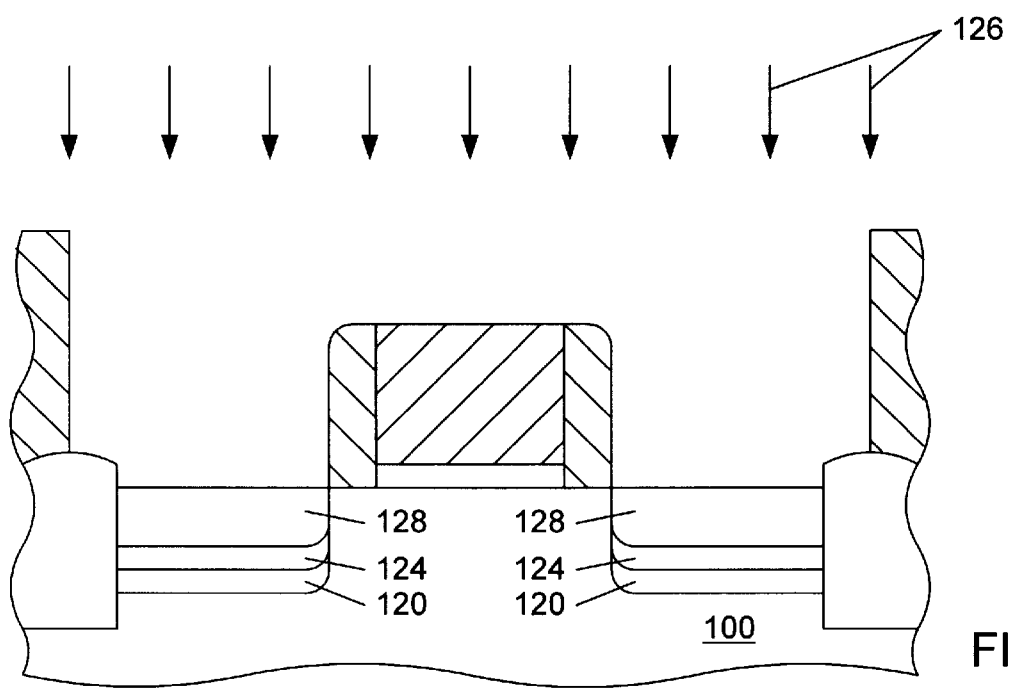
FIG. 9 is a partial cross-sectional view of the semiconductor topography according to a step subsequent to FIG. 8, in which a third impurity implant is forwarded into regions of the semiconductor substrate at a third energy and a third concentration to form third source/drain areas.
Figure 10:
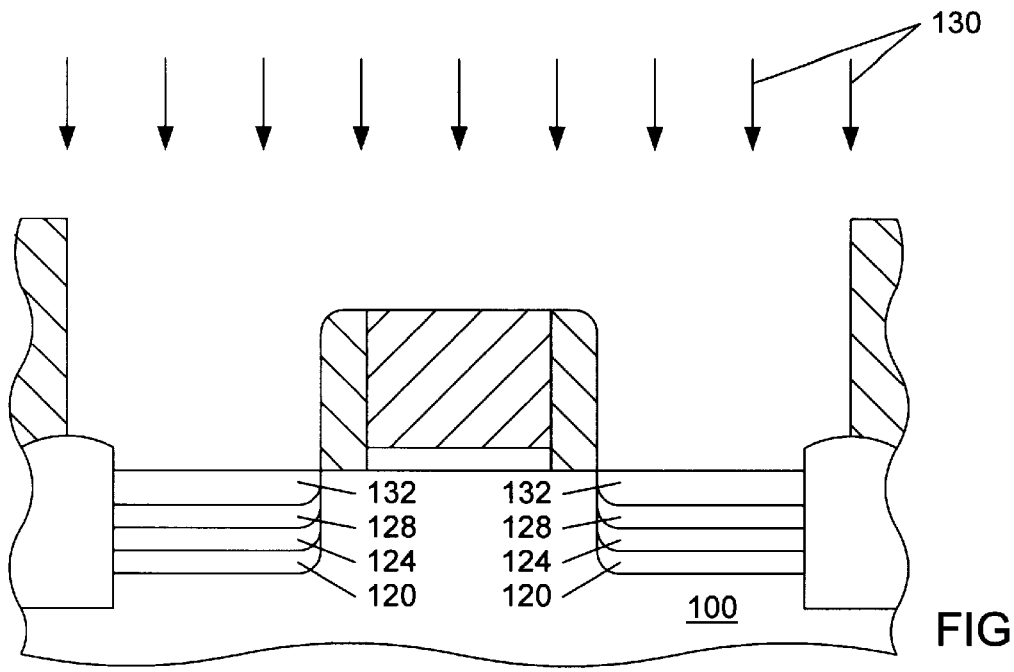
FIG. 10 is a partial cross-sectional view of the semiconductor topography according to a step subsequent to FIG. 9, in which a fourth impurity implant is forwarded into regions of the semiconductor substrate at a fourth energy and a fourth concentration to form fourth source/drain areas.

FIG. 6 illustrates the formation of a photoresist pattern upon the semiconductor substrate 100, gate conductor 110, and spacers 114. Photoresist 116 is deposited using, e.g., liquid chemical deposition and rotational spin drying and selectively patterned and removed from above active region 103 of semiconductor substrate 100. As depicted in FIG. 7, first impurity implant 118 is forwarded into regions of semiconductor substrate 100 not masked by gate conductor 110, spacers 114, or photoresist 116 at a first energy and a first concentration to form first source/drain areas 120 having a first peak impurity concentration at a first depth below upper surface 101 of semiconductor substrate 100. Without removing photoresist 116, second impurity implant 122 (FIG. 8), third impurity implant 126 (FIG. 9), and fourth impurity implant 130 (FIG. 10) are forwarded in sequence into semiconductor substrate 100, similarly to first impurity implant 118. Preferably, second impurity implant 122 has a second energy less than the first energy and a second concentration greater than the first concentration, forming second source/drain areas 124 with a second peak impurity implant concentration at a second depth less than the first depth (FIG. 8). Third impurity implant 126 preferably has a third energy less than the second energy and a third concentration greater than the second concentration, resulting in third source/drain areas 128 with a third peak impurity implant concentration at a third depth less than the second depth (FIG. 9). Likewise, fourth impurity implant 130 preferably has a fourth energy less than the third energy and a fourth concentration greater than the third concentration, resulting in fourth source/drain areas 132 with a fourth peak impurity implant concentration at a fourth depth less than the third depth (FIG. 10).

Figure 11:
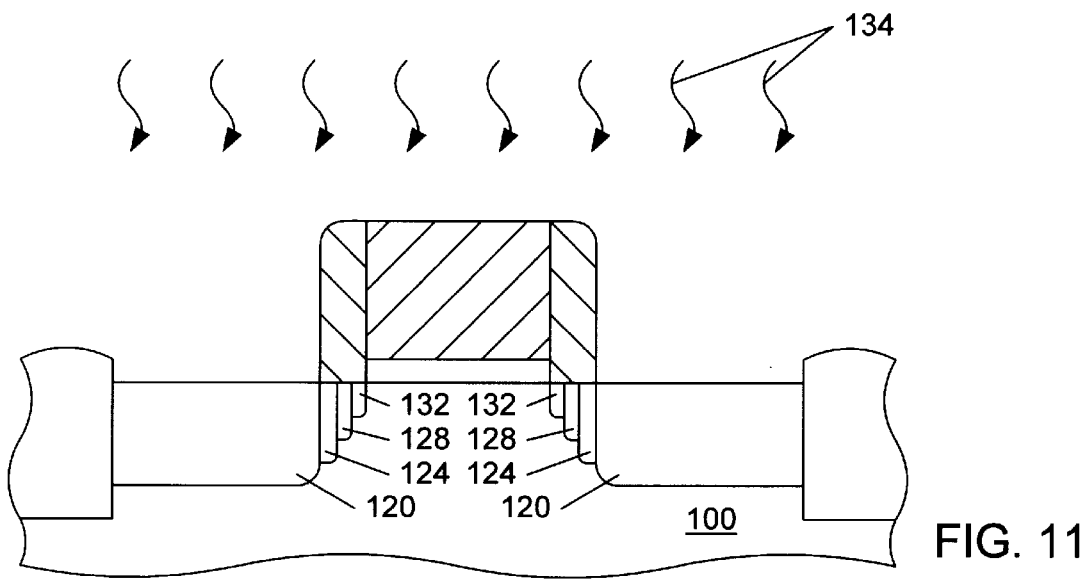
FIG. 11 is a partial cross-sectional view of the semiconductor topography according to a step subsequent to FIG. 10, in which the photoresist is stripped from the semiconductor topography and an implant anneal is performed to form a graded junction.

Following formation of fourth source/drain areas 132, photoresist 116 is stripped from the semiconductor substrate. An implant anneal, indicated in FIG. 11 by reference numeral 134, is then performed to drive the implanted dopant ions toward the channel region of the gate. In an embodiment, the anneal is performed using a high-temperature furnace. In an alternative embodiment, the implant anneal involves rapid thermal anneal (RTA). Due to the graded concentrations, the source/drain implant species will have varying diffusion rates, such that implant ions in the most heavily doped areas will migrate laterally and vertically to a greater extent than implant ions in more lightly doped areas. As depicted in FIG. 11, ions implanted in fourth source/drain regions 132, the most heavily doped regions, exhibit the greatest diffusion during the anneal, and ions implanted in first source/drain regions 120, the most lightly doped regions, exhibit the least diffusion.

Figure 12:
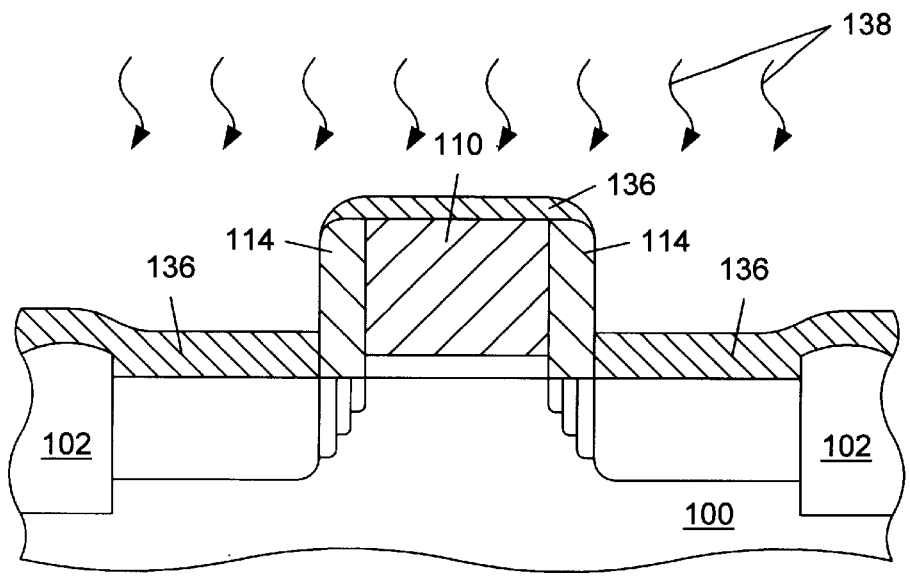
FIG. 12 is a partial cross-sectional view of the semiconductor topography according to a step subsequent to FIG. 11, in which a refractory metal layer is formed across the source/drain regions and the upper surface of the gate conductor following formation of the source/drain implant areas.
Figure 13:
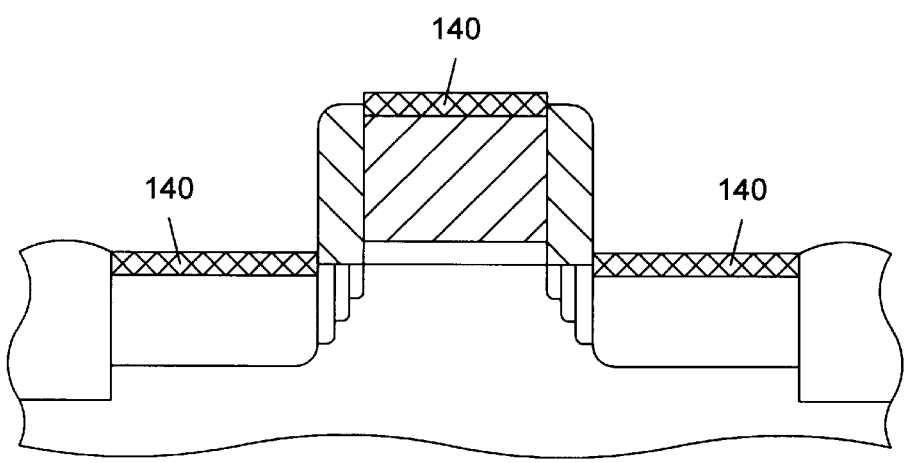
FIG. 13 is a partial cross-sectional view of the semiconductor topography according to a step subsequent to FIG. 12, in which an implant anneal is performed to form metal silicide across the source/drain regions and the upper surface of the gate conductor.

Following the anneal, a refractory metal 136 (e.g., titanium or cobalt) may be formed across the source/drain regions and the upper surface of gate conductor 110, as shown in FIG. 12. The refractory metal may be sputter deposited from a metal target such that the metal travels in a direction substantially perpendicular to horizontally oriented features. The deposited refractory metal may be exposed to a form of radiation capable of increasing the temperature of the refractory metal to above, e.g., 600° C. (FIG. 13). The radiation, indicated by reference numeral 138 in FIG. 13, may be thermal radiation provided from a heated furnace. Alternately, the radiation may be radiant light supplied from, e.g., an arc lamp or a tungsten-halogen lamp using a technique known as rapid thermal processing ("RTP"). Raising the temperature of the refractory metal serves to initiate reaction between metal atoms and silicon atoms of polysilicon gate conductor 110 and the source/drain regions. Any unreacted refractory metal which remains may be etched away using, e.g., a wet etch highly selective to the metal. The resulting metal silicide 140 has a relatively low resistivity and serves as a self-aligned contact region across the source/drain regions and gate conductor 110. Absent refractory metal upon the lower portions of the spacers, no silicide formation occurs at those portions. Consequently, silicide bridging between gate conductor 10 and the source/drain regions is less likely to occur.

It will be appreciated to those skilled in the art having the benefit of this disclosure that this invention is believed to provide a method for forming a graded junction without performing a lightly doped drain implant. Further modifications and alternative embodiments of various aspects of the invention will be apparent to those skilled in the art in view of this description. For example, although the process as depicted in the detailed description includes four dopant implants for the sake of illustration, any number of dopant implants constituting a plurality may be suitable. Further, although in the process as described higher-concentration implants are performed in sequence following lower-concentration implants, the order of the implant steps may be varied, provided that the higher-concentration implants are relatively shallow. It is intended that the following claims be interpreted to embrace all such modifications and changes and, accordingly, the specification and drawings are to be regarded in an illustrative rather than a restrictive sense.

What is claimed is:

1. A method for fabricating a transistor, comprising:
    patterning a gate conductor dielectrically spaced over a channel area within a semiconductor substrate between a source region and a drain region;
    forming, adjacent opposed sidewall surfaces of the gate conductor, a pair of spacers having a spacer lateral thickness;
    implanting a plurality of dopant species into said semiconductor substrate, wherein said implanting comprises at least:
        implanting, at a first energy and a first concentration, a first dopant species into the source and drain regions laterally spaced from the channel area by the spacer lateral thickness; and
        implanting, at a second energy and a second concentration, a second dopant species into the source and drain regions laterally spaced from the channel area by the spacer lateral thickness, wherein the second energy is less than the first energy, the second concentration is greater than the first concentration, and implanting the second dopant species comprises forwarding the second dopant species into the semiconductor substrate at an angle greater than 0° with respect to a surface normal of the semiconductor substrate; and
        annealing the semiconductor substrate following said implanting the plurality of dopant species, wherein said annealing causes lateral migration of said first dopant species by a first lateral distance and lateral migration of said second dopant species by a second lateral distance greater than the first lateral distance.

2. The method as recited in claim 1, wherein the first energy is substantially greater than approximately 35 keV and the second energy is substantially less than approximately 10 keV.

3. The method as recited in claim 1, further comprising forming isolation structures in the semiconductor substrate.

4. The method as recited in claim 1, wherein said annealing forms a graded junction.

5. The method as recited in claim 1, further comprising forming a metal silicide across upper surfaces of the gate conductor and the source and drain regions.

6. A method for fabricating a transistor, comprising:
    patterning a gate conductor dielectrically spaced over a channel area within a semiconductor substrate between a source region and a drain region;
    forming, adjacent opposed sidewall surfaces of the gate conductor, a pair of spacers having a spacer lateral thickness; and
    performing a plurality of implants into the semiconductor substrate, wherein said performing comprises at least:
        performing, at a first energy and a first concentration, a first implant into the source and drain regions laterally spaced from the channel area by the spacer lateral thickness;
        performing, at a second energy and a second concentration, a second implant into the source and drain regions laterally spaced from the channel area by the spacer lateral thickness, wherein the second energy is less than the first energy and the second concentration is greater than the first concentration; and
        performing, at a third energy and a third concentration, a third implant into the source and drain regions laterally spaced from the channel area by the spacer lateral thickness, wherein the third energy is less than the second energy and the third concentration is greater than the second concentration.

7. The process as recited in claim 6, wherein said performing the plurality of implants comprises implanting the same impurity species for each implant.

8. The method as recited in claim 6, wherein said performing the plurality of implants comprises implanting different impurity species.

9. The method as recited in claim 6, further comprising annealing said semiconductor substrate subsequent to said performing the plurality of implants.

10. The method as recited in claim 9, wherein said annealing causes lateral migration over a first lateral distance of impurities introduced by the first implant, lateral migration over a second lateral distance of impurities introduced by the second implant, and lateral migration over a third lateral distance of impurities introduced by the third implant, and wherein the second lateral distance is greater than the first lateral distance and the third lateral distance is greater than the second lateral distance.

11. The method as recited in claim 6, wherein said performing a plurality of implants further comprises performing, at a fourth energy and a fourth concentration, a fourth implant into the source and drain regions laterally spaced from the channel area by the spacer lateral thickness, wherein the fourth energy is less than the third energy and the fourth concentration is greater than the third concentration.

12. The process as recited in claim 11, wherein said performing the plurality of implants comprises implanting the same impurity species for each implant.

13. The method as recited in claim 11, wherein said performing the plurality of implants comprises implanting different impurity species.

14. The method as recited in claim 11, further comprising annealing said semiconductor substrate subsequent to said performing the plurality of implants.

15. The method as recited in claim 14, wherein said annealing causes lateral migration over a first lateral distance of impurities introduced by the first implant, lateral migration over a second lateral distance of impurities introduced by the second implant, lateral migration over a third lateral distance of impurities introduced by the third implant, and lateral migration over a fourth lateral distance of impurities introduced by the fourth implant, and wherein the second lateral distance is greater than the first lateral distance, the third lateral distance is greater than the second lateral distance, and the fourth lateral distance is greater than the third lateral distance.

* * * * *